United States Patent
Zolper et al.

[11] Patent Number: 6,083,781
[45] Date of Patent: Jul. 4, 2000

[54] METHOD FOR MANUFACTURING COMPOUND SEMICONDUCTOR FIELD-EFFECT TRANSISTORS WITH IMPROVED DC AND HIGH FREQUENCY PERFORMANCE

[75] Inventors: John C. Zolper, Vienna, Va.; Marc E. Sherwin, Rockville, Md.; Albert G. Baca, Albuquerque, N. Mex.

[73] Assignee: The United States of America as represented by the United States Department of Energy, Washington, D.C.

[21] Appl. No.: 08/941,264

[22] Filed: Oct. 1, 1997

Related U.S. Application Data

[63] Continuation-in-part of application No. 08/580,015, Dec. 20, 1995, abandoned.

[51] Int. Cl.$^7$ ............................................. H01L 21/338
[52] U.S. Cl. ......................... 438/167; 438/174; 438/518
[58] Field of Search ..................... 438/167, 169, 438/174, 181, 172, 518, 519

[56] References Cited

U.S. PATENT DOCUMENTS 4,905,061  2/1990  Ohmuro et al. .

OTHER PUBLICATIONS

Davies et al., "Anomalous Behaviour of Carbon Implants in Si–doped GaAs", Int. Sum. GaAs and Related Compounds, No. 112, Chap. 5, pp 275–280, 1990.

Gwilliam et al., "The use of Multi–Species Implantation for Carrier Profile Control in GaAs MESFETs Fabricated Using Silicon Ion Implantation", Nucl. Instr. and Methods, B74, pp. 94–97, 1993.

*Primary Examiner*—Tuan H. Nguyen
*Attorney, Agent, or Firm*—Armand McMillan; Dickson G. Kehl; William R. Moser

[57] ABSTRACT

A method for making compound semiconductor devices including the use of a p-type dopant is disclosed wherein the dopant is co-implanted with an n-type donor species at the time the n-channel is formed and a single anneal at moderate temperature is then performed. Also disclosed are devices manufactured using the method. In the preferred embodiment n-MESFETs and other similar field effect transistor devices are manufactured using C ions co-implanted with Si atoms in GaAs to form an n-channel. C exhibits a unique characteristic in the context of the invention in that it exhibits a low activation efficiency (typically, 50% or less) as a p-type dopant, and consequently, it acts to sharpen the Si n-channel by compensating Si donors in the region of the Si-channel tail, but does not contribute substantially to the acceptor concentration in the buried p region. As a result, the invention provides for improved field effect semiconductor and related devices with enhancement of both DC and high-frequency performance.

9 Claims, 5 Drawing Sheets

METHOD FOR MANUFACTURING COMPOUND SEMICONDUCTOR FIELD-EFFECT TRANSISTORS WITH IMPROVED DC AND HIGH FREQUENCY PERFORMANCE

CROSS REFERENCE TO RELATED APPLICATIONS

This is a continuation-in-part of co-pending application Ser. No. 08/580,015, filed Dec. 20, 1995, now abandoned. That application is herein incorporated by reference.

GOVERNMENT RIGHTS

The United States Government has rights in this invention pursuant to Contract No. DE-AC04-94AL85000 awarded by the U.S. Department of Energy.

BACKGROUND OF THE INVENTION

1. FIELD OF INVENTION

This invention pertains to improving performance of compound semiconductor devices, generally, and more particularly to enhancing both DC and AC performance of field-effect transistor devices. Also provided is a method for efficiently producing these enhanced performance devices at lower cost than existing methods. In the preferred embodiment, carbon (C-ion) implants in gallium arsenide (GaAs) -based transistors are utilized both to sharpen the profile of a silicon (Si-ion) n-type channel and to minimize parasitic capacitances associated with buried p-regions. Use of the invention allows for improved DC and AC (high frequency) functioning of metal semiconductor field effect transistors (MESFETs), junction field effect transistors (JFETs) and other similar devices. Further, use of the methods described in fabricating the preferred embodiments will permit more efficient and less costly fabrication than currently used in competing methods while using the same manufacturing technologies currently available and in use.

2. Description of the Related Art

From Ion Implantation in Gallium Arsenide MESFET Technology, Joel P. de Souza and Devendra K. Sadana, *IEEE Transactions on Electron Devices,* Vol. 39, No. 1, Jan. 1992: "The channel length is one of the most important parameters that determines the switching frequency of a MESFET. However, when the channel length becomes shorter than 1 μm the subthreshold conduction begins to increase and a drop in threshold voltage to negative values occurs. These effects are called short-channel effects. These effects, in principle, can be alleviated by forming a buried p layer underneath the channel of a MESFET. The p layer compensates the extended carrier tail present in the dopant profile in the channel and enhances the device transconductance. In addition, the threshold voltage uniformity across the wafer is improved . . . . To create a buried p layer, $Be^+$ or $Mg^+$ are typically implanted to doses of $5 \times 10^{11}$ to $2 \times 10^{12}$ $cm^{-2}$ at energies sufficient to place the projected range of the p species at depths >2–3 times that of the n implant . . . Ideally, the maximum p dose should correspond to a value which creates a fully depleted p-implanted region. Low p doses are typically 100% active after a >760–800° C. RTA (Rapid Thermal Anneal) or furnace anneal. . . . The precise mechanism by which the tail compensation of n dopants occurs in the presence of a p-type dopant is more complicated than what appears at a first glance. The compensation behavior is different depending on whether the p implantation is annealed before or after the n implantation and whether or not a $Si_3N_4$ cap is used during subsequent annealing." From the Conclusions, Id,: ". . . Obviously, optimization of RTA processing for GaAs IC's (integrated circuits) would require better understanding of materials-related phenomena in GaAs." (emphasis added)

There has been an inherent trade-off between optimizing the DC and AC (high-frequency) performance of GaAs MESFETs or JFETs that incorporate a p-type implant below the n-type channel region. This trade-off relates to the need for a high implant dose to realize good carrier confinement, and thus good DC performance (by minimizing short channel effects), and a low dose implant to minimize the gate-to-source capacitance ($C_{gs}$) from the resulting pin junction at the bottom of the channel. Looking to the equations which describe the basic physics of Applicants' device:

$$g_m = K(V_g - V_t)$$
$$f_t = g_m/(2\pi X_{\gamma\Sigma})$$

where $$K = (Z\epsilon m)/(2aL_g)$$

and $V_g$ is the gate voltage
$V_t$ is the threshold voltage of the MESFET
$C_{gs}$ is the capacitance between the gate electrode and the source electrode
$\epsilon$ is the dielectric constant of the semiconductor substrate
m is the mobility of the carrier
a is the thickness of the active layer
$L_g$ is the gate length
Z is the gate width
$g_m$ is the transconductance
$f_t$ is the cut-off frequency With greater conductance, $g_m$, the MESFET has higher current amplification and can drive a greater capacitive load at a high speed. Moreover, with a higher cut-off frequency, $f_t$, the MESFET can switch at a higher speed. U.S. Pat. No. 4,717,685, Method for Producing a Metal Semiconductor Field Effect Transistor, Shigeru Nakajima, issued January 5, 1988, column 1, line 54-column 2, line 30.

Any increase in $C_{gs}$ will degrade the high-frequency performance by reducing both the unity gain cutoff frequency ($f_t$) and the maximum oscillation frequency ($f_{max}$). Unity current gain cutoff frequency, $f_t$, and maximum oscillation frequency, $f_{max}$, are related to each other and the MESFET parasitics as follows:

$$f_t = g_{mi}/2\pi(C_{gs} + C_{gd}) \qquad (1)$$

and $$f_{max} = f_t/2[G_{ds}(R_g + R_s) + 2\pi f_t C_{gd} R_g]^{.5} \qquad (2)$$

where $g_{mi}$ is the intrinsic transconductance, $C_{gs}$ is the gate-to-source capacitance, $C_{gd}$ is the drain-to-gate capacitance, $G_{ds}$ is the output conductance, $R_g$ is the gate resistance, and $R_s$ is the source resistance. Thus increasing $C_{gs}$ degrades both $f_t$ and $f_{max}$. Further, to realize an optimum $f_{max}$, the output conductance, $G_{ds}$, must also be minimized while maintaining $f_t$. This problem becomes more severe as the gate length of the transistor is reduced since carrier confinement is more difficult to realize, thus requiring an increased dose for the buried p-implant that in turn will degrade the high-frequency performance.

The inherent conflict in optimizing both DC and high-frequency performance is illustrated in a study by K Onodera, et al., (IEEE Trans. Electron Device, Vol. 38, No.

3, pp. 429–436, 1991). The authors there reported that in the case of two Be-implant doses used to form a buried p-region in GaAs MESFETs, the gate-to-source capacitance ($C_{gs}$) increased at the higher Be dose ($4 \times 10^{12}$ cm$^{-2}$ compared to $2 \times 10^{12}$ cm$^{-2}$ at 50 keV) thus degrading the unity current gain cutoff frequency ($f_t$) and the maximum oscillation frequency ($f_{max}$). The DC MESFET performance was enhanced by the high Be dose implant as demonstrated by a decrease in output conductance ($g_{gs}$), but high-frequency performance, for reasons stated above, diminished. Prior to the invention disclosed herein, one way of dealing with this situation has been to construct devices wherein the buried p-implant is completely depleted of free carriers to minimize the junction capacitance while achieving good electron confinement in the channel. For conventional p-type implants (Be or Mg), however, neither the DC nor the high-frequency performance is optimized under this condition.

FIG. 1 is presented in order to provide a foundation for later discussion regarding the application and utility of the invention. The figure illustrates in a simplified flow diagram the prior art with respect to the primary steps in the process sequence for an all implanted, self-aligned GaAs n-channel metal semiconductor field effect transistor (nMESFET). The overall method for fabricating a GaAs MESFET is well known (see, for example, J. P. de Souza and D. K Sadana, IEEE Trans. Electron Dev., Vol. 39, pp. 166–175,1992 or M. J. Howes and D. V. Morgan, eds., *Gallium Arsenide: Materials, Devices, and Circuits,* pp. 361–427). It should be understood, though, that an implanted MESFET is only one device in which the present invention has utility. The principles of C-ion implantation described in this patent will also apply to other semiconductor devices such as junction field effect transistors (JFETs), heterostructure field effect transistors (HFETs), and high electron mobility transistors (HEMTs). In addition, non-self-aligned transistor structures that incorporate an implanted channel region will also benefit from this invention.

FIG. 1 (*a*) depicts GaAs substrate material (5) onto which a photoresist (20) is patterned to define a region into which ions are to be implanted. First, according to the prior art, a buried pregion (10) is created by implanting $^9$Be or $^{24}$Mg ions using ion implantation methods well-known to those skilled in the art of semiconductor device manufacturing. An n-channel (15) is then implanted above the buried p-region, typically using $^{29}$Si ions. Referring now to FIG. 1 (*b*), a gate metal contact (18) made from material such as tungsten, tungsten silicide, tungsten nitride or titanium nitride is deposited in contact with the n-channel previously formed. (The figure depicts the situation in which the photoresist (20) is removed. The decision as to whether to remove or to repattem the photoresist will depend on the final configuration of layers desired with respect to any particular application. As with implantation, use of photoresist masking is well established and known to those practicing the art.) FIG. 1(*c*) depicts a second implantation step performed using $^{29}$Si ions to form the n+ source (30) and drain (35) regions of the transistor. Following this step, and after the photoresist removal, the implants are all annealed (typically between 800 and 850° C. for 10 to 60 seconds) to electrically activate the implanted species. Finally, as represented in FIG. 1 (*d*), ohmic source and drain contact metallization (40) is patterned, formed and alloyed.

The role of the buried p-implant is to improve the confinement of electrons in the MESFET channel. Confinement is realized by sharpening the profile of the silicon channel implant and providing a nip junction barrier to electron flow out of the bottom of the channel. The sharpening of the Si-channel implant is seen in simulated ion and carrier profiles such as are depicted in FIG. 3 (which is discussed more in detail, below, in the Detailed Discussion). This sharpening typically is accomplished by implanting acceptor atoms such as Be or Mg in the region just below the Si-channel. A drawback associated with this practice, however, concerns the fact that many of those atoms come to rest beyond the tail of the Si-channel and become active acceptors increasing $C_{gs}$, and robbing the device of its high-frequency efficiency. This problem, however, is overcome by the method of the present invention, wherein C-ions are implanted in the place of Be, Mg or other similar acceptor atoms.

Although the use of C to modify Si-implant profiles has been reported (B. P. Davies, P. Davies, D. M. Brookbands, D. J. Warner, and R. H. Wallis, "Anomalous Behavior of Carbon Implants in Si-Doped GaAs," *Int. Sum. GaAs and Related Compounds,* pp., 275 –280,1990; R. M. Gwilliam, R. J. Wilson, T. D. Hunt, and B. J. Sealy, "The Use of Multi-Species Implantation for Carrier Profile Control in GaAs MESFETs Fabricated Using Silicon Ion Implantation," *Nucl. Instr. and Methods in Phys. Res.,* B74, pp. 94–97, 1993), the unique feature relating to enhanced high-frequency performance is new with this invention. These references point to the efficiency of carbon as a compensator when implanted in silicon-oped GaAs material, specifically with respect to compensating the tail of the Si-implanted channel to produce sharper channel profiles. It is also known that carbon has a low activation efficiency. An important feature of the present invention concerns the distinctive characteristic of C wherein it exhibits low activation as an implanted acceptor by virtue of the fact that it occupies an As-site within the GaAs substrate matrix. Furthermore, the prior art does not incorporate this principle in semiconductor device structures to enhance performance.

BRIEF SUMMARY OF THE INVENTION

The present invention, in one of its preferred embodiments, utilizes carbon ion implantation, in a unique co-implantation with Si ions and subsequent single RTA anneal, to effect improvement in DC performance of GaAs-based and other compound semiconductor-based devices comparable to that seen by the formation of a buried p-region using the prior state-of-the-art method of implanting Group II p-type species (Be, Mg, Zn, or Cd). Because of the unique co-implantation and single anneal employed in the present invention, improvements in AC (high-frequency) performance, compared to the prior art, are also achieved. The fabrication method coupled with the unique activation and compensation properties of carbon make it capable of minimizing parasitic capacitances associated with an implanted buried p-region. The invention makes use of unique properties of C-ions in that they have a low activation efficiency as acceptors when implanted alone in the region below the Si-channel. This low activation stems in part from the fact that, following implantation, C acceptors occupy As-sites rather than Ga-sites. As-vacancies have a higher energy of formation as compared to Ga-vacancies thus contributing to C having a lower activation efficiency than, for example, Be or Mg that occupy Ga-vacancies to become acceptors. At the same time, C-ions that overlap with the Si-channel profile will effectively compensate Si donors, particularly in the tail of the channel profile, and will sharpen the channel donor profile. This combination limits the gate-to-source capacitance associated with the n-channel/buried-p junction, minimizing any reduction in high-frequency operation, while still reducing the DC output conductance. The invention further contemplates implantation using species other than C, and compound semiconductor substrates other than GaAs, so long as the other implant species and substrates conform to the principles detailed here wherein the p-implant species acts to compensate the n-channel tail, but does not significantly increase acceptor concentration in the buried p-region.

Accordingly, it is an object of the present invention to provide a method for manufacturing compound semiconductor devices comprising the steps of providing a compound semiconductor substrate and co-implanting into said compound semiconductor substrate a first species comprising an electron donor and a second species comprising a weakly activated hole acceptor to form a n-channel having a profile which is modified by said second species functioning as an acceptor and also implanting the second species, comprising a weakly activated hole acceptor, by itself in a buried p layer below the n-channel formed in the compound semiconductor, and following both implants with a single rapid thermal or conventional thermal anneal at a temperature of about 750–950° C.

It is another object of the present invention to provide a method of manufacturing compound semiconductor transistor devices wherein the compound semiconductor substrate comprises two or more different elements occupying distinct positions in a crystal matrix prior to implantation, and, following implantation, a first species occupies positions previously occupied predominantly by one element, and a second species occupies positions previously occupied predominantly by a different element wherein said second species occupies positions of an element with a higher energy of formation than that element displaced by the first species.

It is another object of the present invention to provide a compound semiconductor device comprising a compound semiconductor substrate and a first species comprising an electron donor and a second species comprising a weakly activated hole acceptor co-implanted into said compound semiconductor substrate to form a n-channel having a profile which is modified by said second species functioning as a less weakly activated acceptor than when the second species is singly implanted in the region below the n-channel known as the buried p region.

It is another object of the present invention to provide a method of field-effect transistor device manufacture wherein a dopant is selected for implantation alone or in combination with other dopants which is capable of both actively compensating donor atoms in the n-channel region and exhibiting low activation efficiency in the p-region.

It is another object of the present invention to provide a method for producing doped compound semiconductors for use in field effect transistor applications wherein carbon ions are implanted in order to sharpen the n-channel profile (thus enhancing carrier confinement) while not increasing gate-to-source capacitance, $C_{gs}$, sufficiently to significantly degrade high frequency performance.

It is another object of the present invention to provide a less expensive, more efficient method of semiconductor fabrication than that in current use by implanting at least two species of dopants at no more than two distinct levels, having a minimum number of separate steps such as photo resists, and using a single rapid thermal anneal (RTA) at moderate temperatures of about 750–950° C. for about 15 seconds.

It is another object of the present invention to use doses on the order of about $10^{12}$ to $5 \times 10^{13}$ ions $cm^{-2}$ of a p-type dopant, such as carbon, in a buried p region beneath an n-channel for optimizing both DC and AC performance of several classes of field-effect transistors and related semiconductors.

It is another object of the present invention to utilize the unique activation characteristics of C-ions in GaAs enabling them to serve as active compensators when co-implanted with Si in an n-region, but still exhibit low activation efficiency outside the presence of a significant amount of Si in a p-region.

It is another object of the present invention to provide field effect transistor devices embodying the use of implanted carbon as a dopant rendering those devices capable of exhibiting good DC as well as good high-frequency performance.

It is another object of the present invention to provide semiconductor devices wherein output conductance and sub-threshold current are reduced as compared with a transistor not comprising the second species and not fabricated using the methods of the present invention.

It is another object of the present invention to provide carbon-implanted devices wherein unit current gain cutoff frequency ($f_t$) is increased with respect to transistors implanted using methods equivalent to the present invention but with comparable doses of Group II p-type species instead of carbon.

It is another object of the present invention to provide carbon-implanted devices wherein maximum oscillation frequency ($f_{max}$) is increased with respect to transistors implanted using methods equivalent to the present invention but with comparable doses of Group II p-type species instead of carbon.

Upon further study of the specification and appended claims, further objects and advantages of the invention will become apparent to those skilled in the art.

These objects have been attained by providing, in the preferred embodiment, a method of manufacturing compound semiconductor devices, including the family of field effect transistors, in which C-ion co-implantation and a unique single anneal is utilized to effectively sharpen the n-channel profile while providing a means to reduce the p-type concentration below the n-channel thereby minimizing parasitic capacitances. These objects have further been attained by providing the semiconductor devices which embody his C-ion co-implant and single anneal technology.

DETAILED DISCUSSION

Carbon ($^{12}$C or $^{13}$C) is unique among p-type dopants in GaAs in that it occupies an As-site to become an electrically active acceptor. All other p-type-only impurities (excluding the amphoteric dopants Ge, Si and Sn) in GaAs (Be, Mg, Zn and Cd) occupy a Ga-site to become active acceptors. Unlike other p-type species that typically have close to 100% activation in GaAs, C, implanted by itself, in GaAs has a low activation efficiency of typically 50% or less (S. J. Pearson and C. R. Abernathy, Appl. Phys. Lett. 55, pp. 678–680, 1989).

This is for two reasons: First, since C is a relatively low mass ion it generates fewer vacancies during implantation compared to heavier ions. Second, As-vacancies have a higher energy of formation than Ga-vacancies (R. W. Jansen and O. F. Sankey, Phys. Rev. B, Vol. 39, pp. 3192–3206, 1989) and, therefore, fewer As-vacancies will be available for the C-ion to occupy, resulting in a reduction in C's activation efficiency as an acceptor.

The activation efficiency of implanted C can be increased by co-implanting a heavier ion to increase the lattice damage and thus the As-vacancy concentration. An example of co-implantation is implanting C along with Ga-ions thereby increasing the As-vacancy concentration both by the implantation bombardment itself and by altering the local stoichiometry of the crystal. Similarly, when C is co-implanted with Si, the Si implant will create additional As-vacancies thus allowing the C-ion to occupy an As-site and act as an acceptor atom. In the Si/C case, since the Si-ion will occupy a Ga-site to become a donor atom ($Si_{Ga}$) and the C will occupy an As-site to become an acceptor atom ($C_{As}$), the region of Si/C co-implantation will be partially or completely compensated (electron concentration (n)=$N(Si_{Ga})$–$N(C_{As})$ for $N(Si_{Ga})>N(C_{As})$). In the region where Si-ions have not been implanted, as in the MESFET below the Si-channel implant, the C-ions will not have additional As-vacancies to occupy and the activation efficiency will be diminished. This combination of activation properties makes C ideal for compensating the tail of a Si-channel implant while at the same time minimizing the concentration of activated acceptors below the channel. The minimization of the buried p region is critical to minimizing $C_{gs}$ and improving the high-frequency performance of the transistor.

Figure 1A:
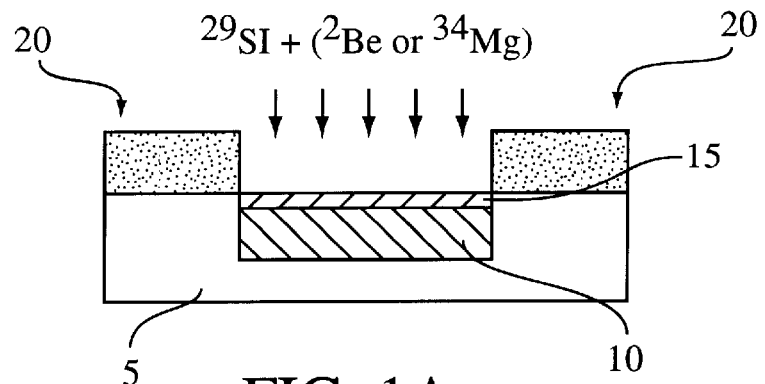
FIGS. 1 (a) through 1 (d) illustrate prior art with respect to MESFET processing and together comprise a flow diagram showing steps used in manufacturing an all-implanted, self-aligned GaAs n-channel metal semiconductor field effect transistor (n-MESFET). These figures are provided to assist in understanding the utility of the present invention.
Figure 1B:
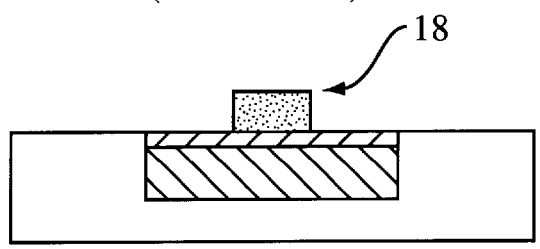
Figure 1C:
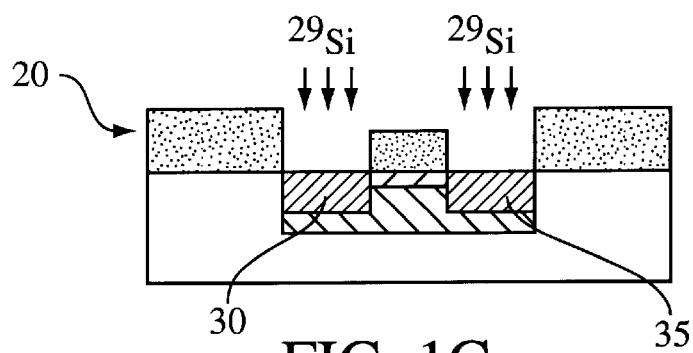
Figure 1D:
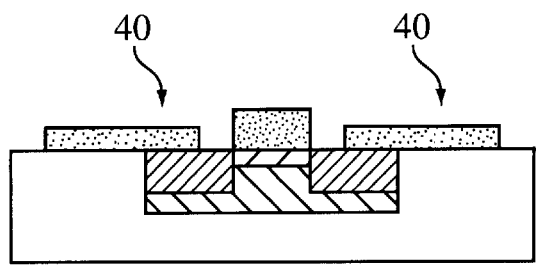
Figure 2:
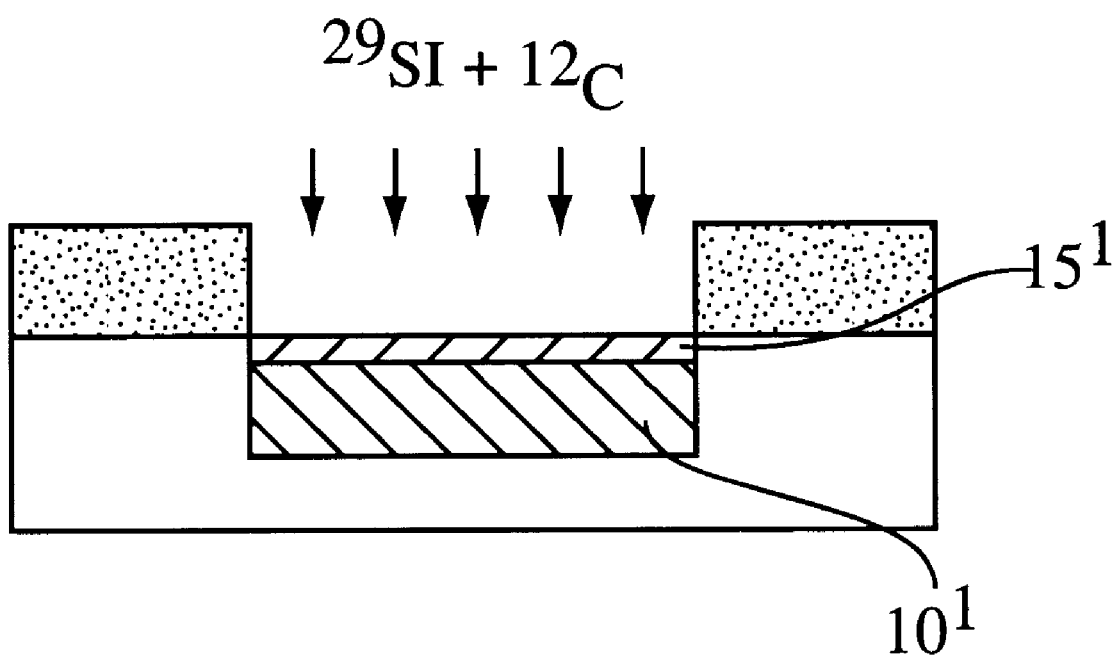
FIG. 2 is a diagram illustrating the use of a combined implant to form the n-channel of a MESFET according to the principles of this invention.

FIG. 2 is similar to FIG. 1(a) in that it depicts the step of forming the n-channel during semiconductor processing. FIG. 2 goes beyond the prior art, though, to illustrate the use of a combined implant (co-implant) according to the best mode of this invention. Si and C are co-implanted in order to create a Si-ion (donor) -doped n-channel (15') modified by the C-ions and a low-activation p-region (10') containing C-ions beneath the n-channel. The C-ion implantation in the buried p region and co-implantation with Si in the n-channel, achieves the objects of the invention because of the favorable attributes of carbon with regard to its low activation efficiency as an acceptor when implanted alone in the buried p-region and its improved activation efficiency when a co-implantation is performed in the n-channel. It should be understood, however, that the invention encompasses the implantation of any dopant which exhibits implant activation properties similar to those described for C and C in combination with Si in the n-channel. It is contemplated that ions or ion combinations which include atoms other than $^{12}$C or $^{13}$C, alone, will serve this purpose and will fall within the scope of the claimed invention. Likewise, the scope of the invention is not intended to be limited to use in GaAs semiconductor devices, but rather to include other forms of compound semiconductors for which the principles disclosed here are applicable.

Figure 3:
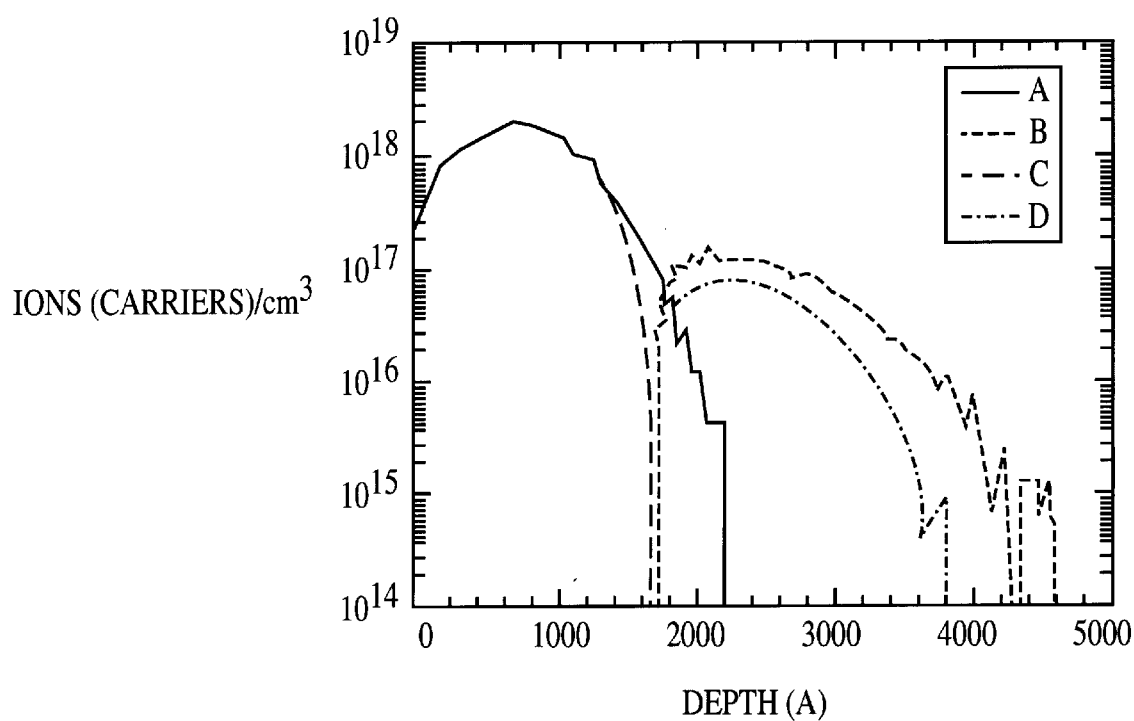
FIG. 3 is a graph showing simulated (TRIM92) ion and carrier profiles for a GaAs MESFET with either a C or Mg backside implant.

FIG. 3 depicts, in a graphical format, data which show sharpening of the Si-channel implant profile using different types of p-implants. The data shown are TRIM92 simulated ion and carrier profiles for a GaAs MESFET comparing C (implanted at 95 keV to a distribution of $3\times10^{12}$ ions cm$^{-2}$) and Mg (implanted at 150 keV to a distribution of $3\times10^{12}$ ions cm$^{-2}$) backside implants using standard ion implantation techniques known to those skilled in the art. (See J. F Siegler, J. P. Biersack, U. Littmark *The Stopping and Range of Ions in Solids,* Vol. 1, p. 202, Pergamon Press, New York, 1985, for a discussion of TRIM92 simulations.) Curve A is the simulation of the Si-ion implant profile for a 70 keV, $2\times10^{13}$ cm$^{-2}$ $^{29}$Si-channel implant. Curve B represents the difference of the Si-implant profile and the co-implantation of Si with C (95 keV, $3\times10^{12}$cm$^{-2}$) profile ($N(SiG_a)$–$N(C_{As}$ 100% activation)) and will correspond to the final electron profile (n) for the channel neglecting dopant diffusion, implant channeling, and depletion effects. Implant channeling, in particular, will make the initial Si-channel profile broader, therefore benefiting even more from the profile tailoring effect of the buried p-implant. By realizing enhanced carrier confinement in the n-channel, device modulation is improved by reducing the off-state leakage (reduced sub-threshold currents) and on-state conductance (reduced output conductance, $G_{ds}$). Sharpening of the implanted Si n-channel profile is accomplished by introducing activated acceptor atoms in the same region as the Si n-channel tail thereby compensating some or all of the Si-donors in that region. Prior to this invention, this channel sharpening was accomplished by implanting Be or Mg ions with a projected depth equal to two to three times the projected depth of the Si n-channel implant. While such Be or Mg implants are effective in modifying the Si n-channel profile, some portion of the implanted Be or Mg ions came to rest beyond the tail of the Si n-channel (see Curve D in FIG. 2 for p=N(Mgc, 100% activation)–($N(Si_{Ga})$ for $N(Mg_{ca})>N(Si_{Ga})$ with a Mg implant of 150 keV, $3\times10^{12}$ cm$^{-2}$) and do not contribute to compensating the Si-donors in the n-channel tail, but rather, become active acceptors with close to 100% activation efficiency in the n-channel tail. The acceptor atoms beyond the Si n-channel tail form a buried p-region and increase the gate-to-source capacitance ($C_{gs}$) by creating a nip junction at the bottom of the n-channel. Increasing $C_{gs}$ will degrade the transistor high-frequency performance, as described later, and is the reason the present invention improves on the state-of-the-art wherein Be or Mg implantation is done or C co-implantation is not done using a single RTA anneal of about 750–950° C. By using C implantation to modify the Si-channel profile, as described in detail below, the increase in $C_{gs}$ is reduced and the high-frequency performance is enhanced over a similar Be or Mg implanted device or C-implanted device without co-implantation followed by a single RTA anneal. The reduction in $C_{gs}$ with a single RTA annealed, co-implanted device using as one of the preferred embodiments, Si and C in the n-channel and C, alone in the buried p-region, is a result of the lower activation efficiency of C in the region below the Si-implanted n-channel as simulated in FIG. 2, curve C (p=$N(C_{As}$ 50% activation)–$N(Si_{Ga})$ for $N(C_{As})>N(Si_{Ga})$) where a 50% activation efficiency for C is assumed.

The relationships between $f_t$ and $f_{max}$ and MESFET parasitics are $$f_t = \frac{g_{mi}}{2\pi(C_{gs} + C_{gd})} \tag{1}$$

and $$f_{max} = \frac{f_t}{2[G_{ds}(R_g + R_s) + 2\pi f_t C_{gd} R_g]^{1/2}} \quad (2)$$

where $g_{mi}$ is the intrinsic transconductance, $C_{gs}$ is the gate-to-source capacitance, $C_{gd}$ is the drain-togate capacitance, $G_{ds}$ is the output conductance, $R_g$ is the gate resistance, and $R_s$ is the source resistance. It can be shown from Equations 1 and 2 that any increase in $C_{gs}$ will degrade both $f_t$ and $f_{max}$. In addition, to realize a high $f_{max}$ the output conductance ($G_{ds}$) must also be minimized while maintaining a high $f_t$. This further demonstrates the significance of this invention and its ability to relax the design tradeoff between DC performance (minimizing $G_{ds}$) and AC performance (maximizing $f_t$ and $f_{max}$) for a given buried p-implant dose.

The utility of the invention has been demonstrated in the DC and high-frequency performance of a self-aligned, all ion implanted, GaAs nJFET by comparing a Mg-implanted buried player to a C-implanted buried player (with a co-implanted Si and C n-channel).

Two implant doses were studied for the buried p-region: $1.5 \times 10^{12}$ cm$^{-2}$ and $3 \times 10^{12}$ cm$^{-2}$. Mg implants were done at 210 keV and the C-implants were done at 95 keV. The Si n-channel implant dose was varied for each device to give a threshold voltage, $V_{th}$, of approximately 0.25 V. The need for different n-channel implants for the different backside implants is a result of the different activation and depletion properties of the two implant species. Table 1 summarizes the DC performance of the four 0.5 μm nJFETs. To account for slight differences in the threshold voltage of the devices, the transconductance ($g_m$) and the saturation current ($I_{sat}$) are reported at a set voltage above threshold ($V_{gs} - V_{th} = 0.8$ V). The DC results in Table 1 are comparable for nJFETs with the same buried p-implant dose independent of the implanted species, Mg or C.

Figure 4A:
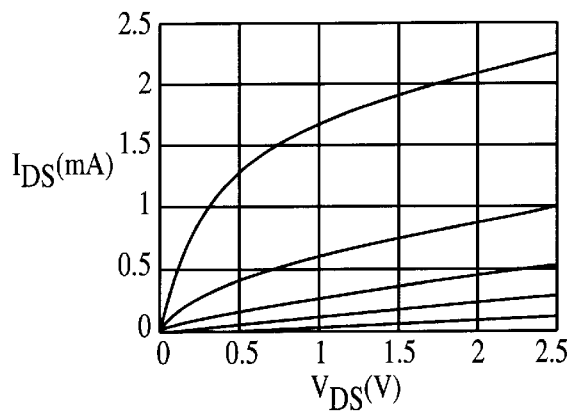
FIGS. 4 (a)–4(d) is a series of graphs showing the relationship of $I_{ds}$ versus $V_{ds}$ for all-implanted GaAs nJFETs to demonstrate the DC performance of devices using the principles of the invention compared with that of devices using the prior state-of-the-art technology.
Figure 4C:
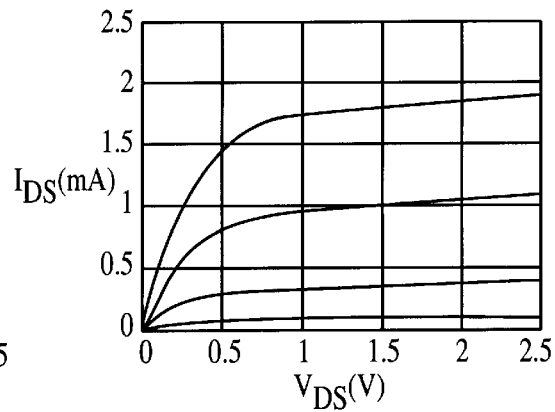
Figure 4B:
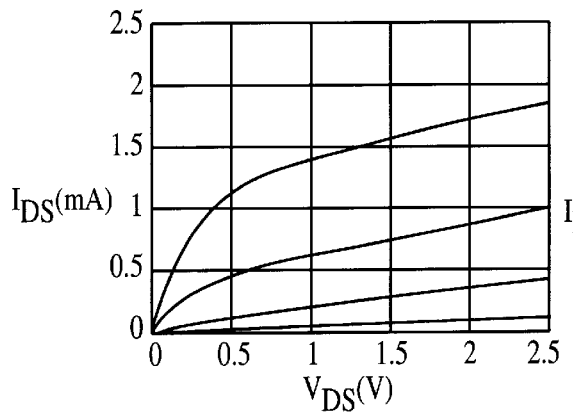
Figure 4D:
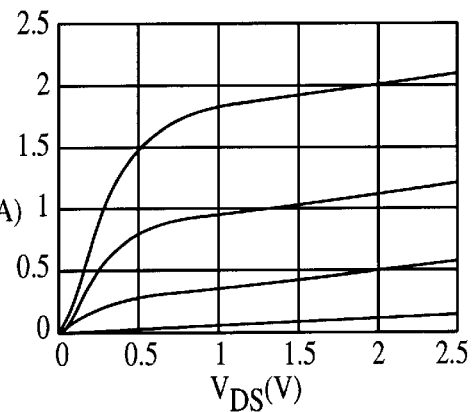

FIG. 4(a)–(d) shows $I_{ds}$ versus $V_{ds}$ (DC JFET performance) for the four backside conditions summarized in Table 1. (FIG. 4(a) depicts data for Mg at $1.5 \cdot 10^{12}$, FIG. 4(b) depicts data for C at $1.5 \cdot 10^{12}$, FIG. 4(c) depicts data for Mg at $3.0 \cdot 10^{12}$, and FIG. 4(d) depicts data for C at $3.0 \cdot 10^{12}$.) The transconductances and saturation currents are comparable for JFETs with the same backside implant dose independent of the implant species. The high dose backside implant JFETs have low output conductance (6 to 9 mS/mm) and subthreshold slopes (80 to 90 mV/decade) indicative of good channel confinement for these nominally 0.5 μm gate length devices.

Figure 5A:
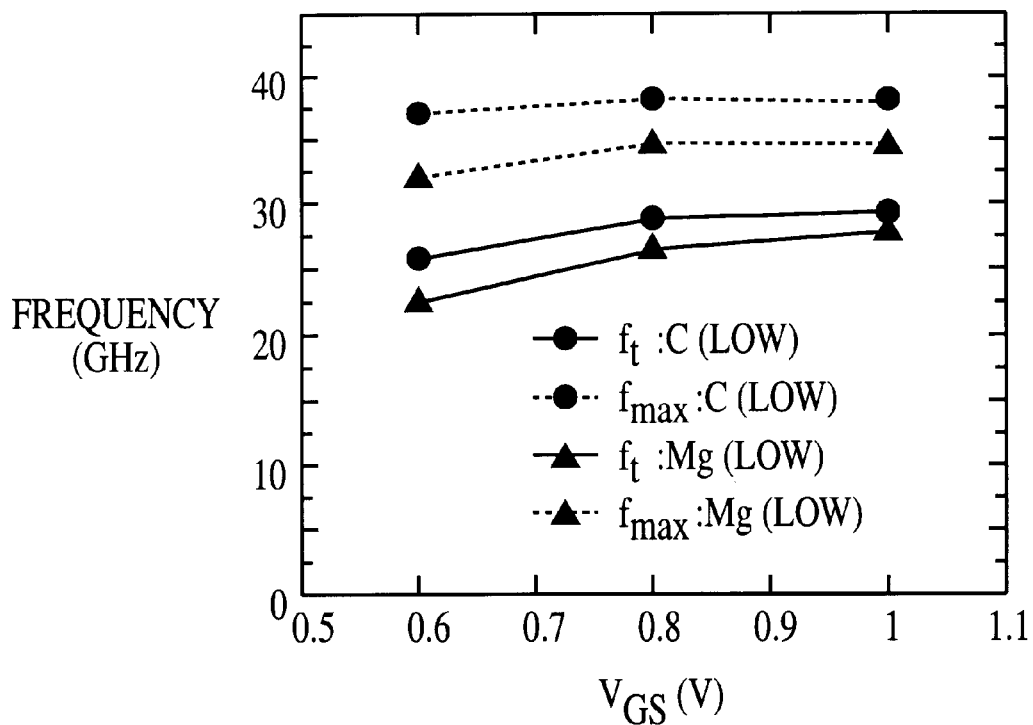
FIG. 5 is a graph showing high-frequency performance metrics for all-implanted GaAs n-JFETs constructed using different Mg and C buried p-implants.
Figure 5B:
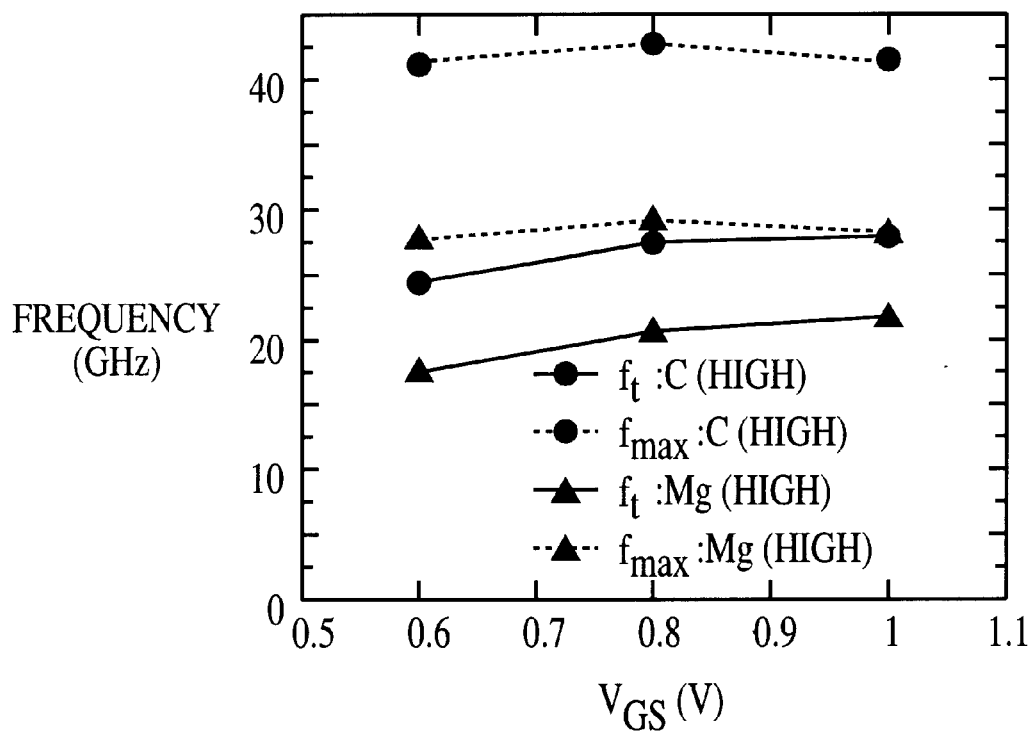

FIG. 5 shows the high-frequency performance metrics ($f_t$ and $f_{max}$) for the four nJFETs of Table 1. The C co-implanted JFETs demonstrate enhanced high-frequency performance over the Mg-implanted devices in all cases. The C co-implanted JFET with the high dose ($3 \times 10^{12}$ cm$^{-2}$) demonstrates a 28% increase in $f_t$ (to 28.3 GHz @$V_{GS}$=1 V) and a 46% increase in $f_{max}$ (to 43.2 GHz @$V_{GS}$+0.8 V) over the comparable high dose Mg-backside JFET. In comparison to the lower dose backside implanted JFETs, the higher dose C co-implanted JFETs showed less degradation in $f_t$ (6.3% @$V_{GS}$=1.0 V) with an enhancement in $f_{max}$ (+11.6% @$V_{GS}$= 9.8 V) while the Mg-implanted devices degraded sharply for the higher dose implant (–23.5% in $f_t$@$V_{GS}$=1.0 V and –16.8% in $f_{max}$ @$V_{GS}$0.8 V). The improvement on $f_{max}$ for the C-backside sample is a result of the reduced output conductance ($G_{ds}$) without an appreciable increase in the gate-to-source capacitance as described below.

TABLE 2

| Buried p-implant (Mg @ 210 keV, C @ 95 keV) | $C_{gd}$ (fF/mm) | $C_{ds}$ (fF/mm) | $C_{gs}$ (fF/mm) |
|---|---|---|---|
| Mg: $1.5 \cdot 10^{12}$ | 247 | 386 | 750 |
| C: $1.5 \cdot 10^{12}$ | 262 | 375 | 786 |
| Mg: $3.0 \cdot 10^{12}$ | 236 | 450 | 984 |
| C: $3.0 \cdot 10^{12}$ | 226 | 345 | 829 |

The reason for the enhanced performance of the C co-implanted devices is evident from the extracted JFET capacitances summarized in Table 2. For the high dose JFETs, the C-backside JFET has 4.2% lower gate-to-drain capacitance ($C_{gd}$=226 fF/mm), 23.3% lower drain-to-source capacitance ($C_{ds}$=345 fF/mm) and 15.8% lower gate-to-source capacitance ($C_{Gs}$=829 fF/mm) compared to the high dose Mg-backside JFET ($C_{gd}$=236 fF/mm, $C_{ds}$=450 fF/mm, and $C_{gs}$=984 fF/mm) at a gate bias of 1 V. We ascribe this reduced capacitance and increased high-frequency performance to the fewer activated C acceptors, compared to Mg, below the n-channel in the C-backside JFET. The lower acceptor concentration creates less n-channel depletion with more depletion of the p-side of the n-channel/buried-p junction for a net larger depletion region and a corresponding reduction in junction capacitance ($C_{gs}$). The reduced n-channel charge depletion is also evident in the lower n-channel dose required in the C-backside compared to the Mg-backside JFET for the same threshold voltage (see Table 1).

These results comparing Mg-implanted to C co-implanted JFETs clearly demonstrate the advantage of the invention over the previous state-of-the-art. In particular, a 28% increase was demonstrated in $f_t$ and a 43% increase was demonstrated in $f_{max}$ for the C co-implanted device over the Mg-implanted device with equal or better DC performance

TABLE 1

| Buried p-implant (Mg @ 210 keV, C @ 95 keV) | Si n-Channel implant dose ($\cdot 10^{13}$ cm$^{-2}$) | $V_{th}$ (V) | $I_{sat}$ (mA/mm) | $g_m$ (mS/mm) | $g_{ds}$ (mS/mm) | sub-threshold slope (mV/decade) |
|---|---|---|---|---|---|---|
| Mg: $1.5 \cdot 10^{12}$ | 1.2 | 0.18 | 94 | 242 | 26 | 200 |
| C: $1.5 \cdot 10^{12}$ | 1.2 | 0.30 | 99 | 248 | 15.5 | 110 |
| Mg: $3.0 \cdot 10^{12}$ | 1.6 | 0.23 | 100 | 201 | 6.2 | 80 |
| C: $3.0 \cdot 10^{12}$ | 1.3 | 0.20 | 98 | 209 | 9.0 | 90 |

($G_{ds}$ and sub-threshold slope). It is important to also note that the invention is compatible with existing GaAs MESFET production techniques. Therefore, insertion of the new method will have limited impact on the other aspects of the process while giving significant performance improvements, particularly for sub-micron and deep sub-micron gate length devices.

Having thus described the invention, it will be obvious to those of ordinary skill in the art that various modifications can be made within the spirit and scope of the present invention. It is intended to encompass all such variation as fall within the spirit and scope of the invention.

What is claimed is:

1. A method for manufacturing compound semiconductor devices comprising the steps of:

(a) providing a compound semiconductor substrate comprising at least two different elements occupying separate positions in a crystal matrix;

(b) choosing a first species comprising an electron donor and a second species comprising a weakly-activated hole acceptor, said second species capable of actively compensating donor atoms when implanted into a substrate in the presence of said first species and also having a low activation efficiency when implanted alone;

(c) co-implanting onto said substrate said first species and said second species, said first species occupying positions on said substrate previously occupied by one of said at least two different elements and said second species occupying positions on said substrate previously occupied by another of said at least two different elements, to form a n-channel doped with said first species and modified by said second species, whereby, in the region of overlap between said first and second species, said second species actively compensates said first species, and also to form a low-activation p-region buried beneath the n-channel, said p-region containing said second species alone;

(d) performing a single anneal of said substrate following said co-implanting step, to electrically activate both said implanted first and second species; and (e) forming in said substrate a drain region, a source region, and a gate region, said drain region and said source region being separated by said gate region, each of said regions comprising an electrically conductive material for subsequent electrical connection.

2. The method of claim 1 wherein said compound semiconductor substrate is a III–V semiconductor material.

3. The method of claim 2 wherein said III–V semiconductor material is GaAs.

4. The method of claim 1 wherein said first species is Si.

5. The method of claim 1 wherein said second species is C.

6. The method of claim 5 wherein the implant dose of C is within the range of $1.0 \times 10^{12}$ ions $cm^{-2}$ to $5.0 \times 10^{13}$ ions $cm^{-2}$.

7. The method of claim 1, wherein the annealing step further comprises performing a single anneal at moderate temperature of about 750–950° C.

8. The method of claim 1, wherein the annealing step further comprises performing a rapid thermal anneal (RTA).

9. The method of claim 1, wherein the annealing step further comprises annealing for about 5 to 30 seconds after the co-implanting step.

* * * * *